United States Patent
Murata

(10) Patent No.: US 11,193,199 B2
(45) Date of Patent: Dec. 7, 2021

(54) SPUTTERING TARGET CAPABLE OF STABILIZING IGNITION

(71) Applicant: JX Nippon Mining & Metals Corporation, Tokyo (JP)

(72) Inventor: Shuhei Murata, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 213 days.

(21) Appl. No.: 16/082,979

(22) PCT Filed: Mar. 7, 2017

(86) PCT No.: PCT/JP2017/008959
§ 371 (c)(1),
(2) Date: Sep. 7, 2018

(87) PCT Pub. No.: WO2017/154888
PCT Pub. Date: Sep. 14, 2017

(65) Prior Publication Data
US 2019/0078195 A1 Mar. 14, 2019

(30) Foreign Application Priority Data
Mar. 9, 2016 (JP) .............................. JP2016-045610

(51) Int. Cl.
*C23C 14/34* (2006.01)
*H01J 37/34* (2006.01)

(52) U.S. Cl.
CPC ...... *C23C 14/3407* (2013.01); *H01J 37/3423* (2013.01); *H01J 37/3426* (2013.01); *H01J 37/3435* (2013.01); *H01J 37/3491* (2013.01)

(58) Field of Classification Search
CPC .............. C23C 14/3407; H01J 37/3414; H01J 37/3426
See application file for complete search history.

(56) References Cited

U.S. PATENT DOCUMENTS

| | | | |
|---|---|---|---|
| 6,176,944 B1 | 1/2001 | Snowman et al. | |
| 6,503,380 B1 | 1/2003 | Buehler | |
| 6,955,748 B2 | 10/2005 | Kim | |
| 9,685,307 B2 | 6/2017 | Miyashita | |
| 2005/0072668 A1 | 4/2005 | Kennedy et al. | |
| 2007/0056688 A1* | 3/2007 | Kim ................... | H01J 37/3435 156/293 |
| 2016/0217983 A1 | 7/2016 | Oda | |

FOREIGN PATENT DOCUMENTS

| | | |
|---|---|---|
| CN | 102383100 A | 3/2012 |
| CN | 203474887 U | 2/2014 |
| JP | 2003-027225 A | 1/2003 |
| JP | 2003-226965 A | 8/2003 |
| JP | 2004-084007 A | 3/2004 |

* cited by examiner

*Primary Examiner* — John J Brayton
(74) *Attorney, Agent, or Firm* — Howson & Howson LLP

(57) ABSTRACT

A sputtering target comprising a flat part and a tapered part on a sputter surface, wherein of the tapered part includes a crystal distortion having an average KAM value of 0.5° or more. It is possible to lower the ignition failure rate of ignition (plasma ignition), and start the sputter process stably. Because the downtime of the device can thereby be shortened, it is possible to contribute to the improvement in throughput and cost performance.

6 Claims, 2 Drawing Sheets

(a)          (b)

[FIG. 1]
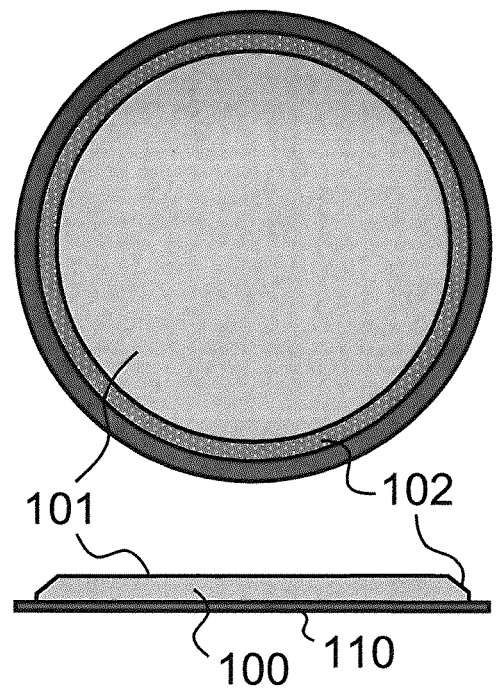
[FIG. 2]
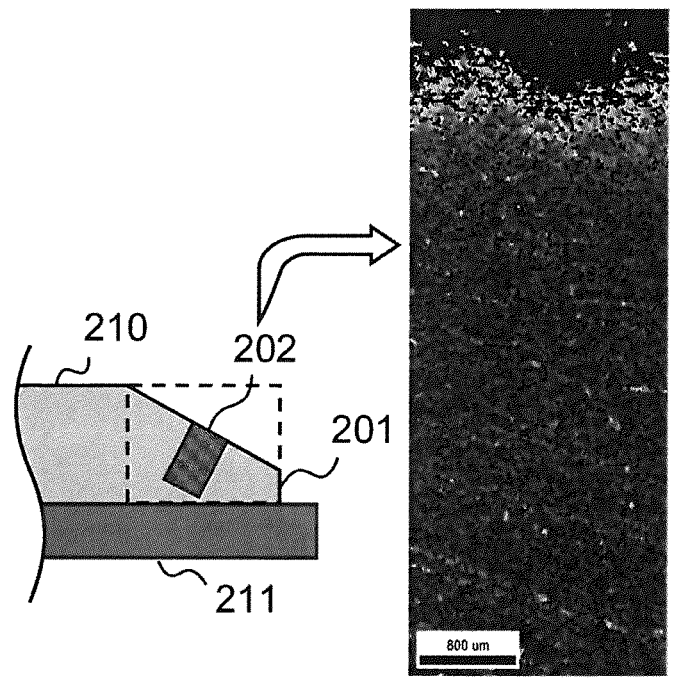
(a)  (b)

[FIG. 3]
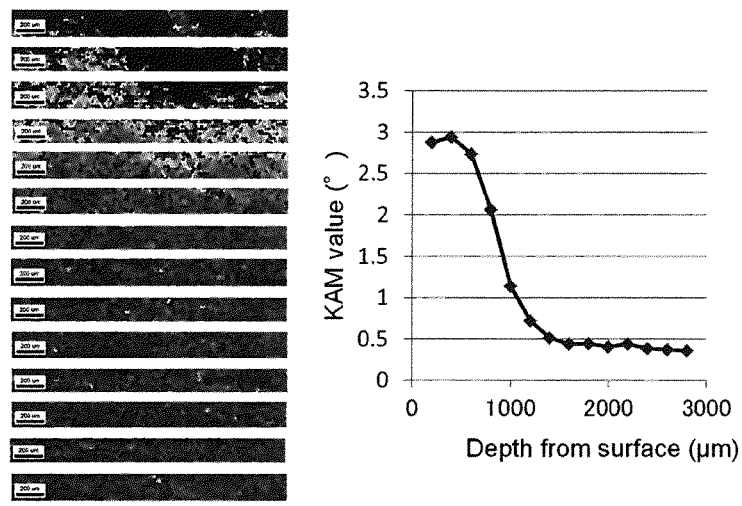
[FIG. 4]
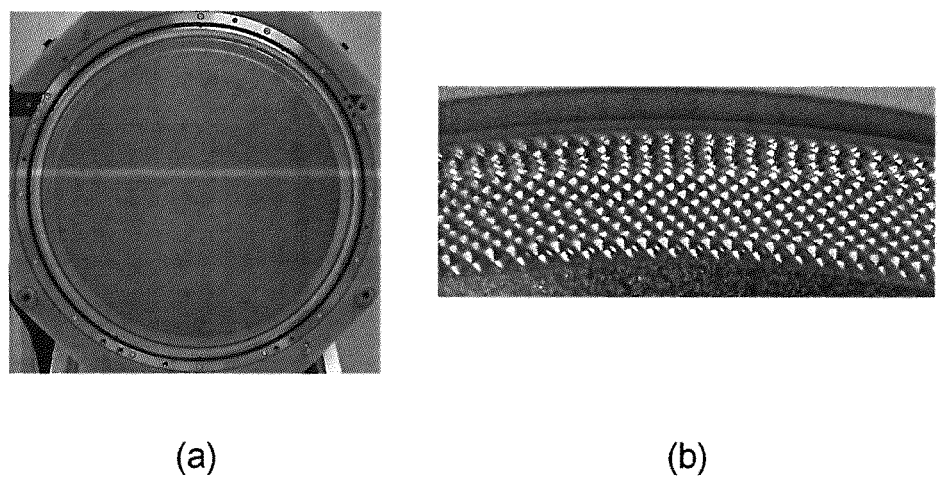
(a)  (b)

SPUTTERING TARGET CAPABLE OF STABILIZING IGNITION

BACKGROUND

The present invention relates to a sputtering target capable of stably exciting/generating initial plasma (also referred to as ignition or plasma ignition) at the start of sputtering.

The wiring of semiconductor integrated circuits is being demanded of further thinning as time goes by, and sputtering, which is one type of physical vapor deposition method, is being used for forming thin films to be used as such wiring. In recent years, magnetron sputtering which controls plasma with electromagnetic force is often used to increase the deposition rate of sputtering. In sputtering that is used for such cutting-edge technology, it is indispensable to use a target which enables the deposition process to be stable and controlled easily. When stable deposition is not possible due to the stoppage of the device caused by a plasma ignition failure or the generation of voltage fluctuation, not only will the productivity deteriorate, it may also deteriorate the quality of the product. Moreover, in cases where control is difficult, it may not be possible to start and maintain stable deposition when the deposition conditions are intentionally changed. A plasma ignition failure is a state where plasma cannot be generated (ignition miss).

A copper wire is generally used as the wiring of semiconductor integrated circuits. In recent years, a sputtering target made from tantalum is sometimes used to form a barrier film of the copper wire. Because a barrier film is also applied to wiring holes with a high aspect ratio (ratio of depth of step and opening), it is necessary to control the deposition rate and stably form ultrathin films. Moreover, it is also necessary to perform sputtering at a high power in order to improve the sputter yield, and desired is a target with a low deposition rate which is advantageous for controlling the film thickness even under the foregoing conditions. Consequently, this kind of deposition control technology is playing a role in the development of PVD.

As a tantalum target, which is an example of the target for forming the barrier film described above, a product having a purity of 4N5 (99.995 wt %) is being used from the perspective of versatility, but in certain cases a product substantially having a purity of 6N (99.9999 wt %) is also used in order to suppress, as much as possible, the deterioration in adhesiveness of the film caused by impurities and the increase of leak currents. In recent years, this kind of ultrahigh purity material is often used to increase the freedom of wiring design.

When the purity of a target is increased, the target material becomes softened and, due to the nonuniform orientation of the texture after plastic working and the coarsening of crystals during recrystallization via heat treatment, there are cases where it is difficult to control the quality of the target. While these problems can be resolved to a certain extent by strictly controlling the production process of the target, even with the thus produced high purity target, new problems may arise as a result of the operating environment of the target becoming stricter.

Sputtering is a phenomenon which continuously repeats a cycle in which voltage is applied with a target as the cathode, incidental electrons or primary electrons discharged from the target are accelerated by the applied field and engage in ionizing collision with the introduced Ar gas atoms to generate Ar-produced plasma, Ar ions are drawn toward and collide with the target as the cathode, the target material is sputtered and secondary electrons are discharged, and Ar is once again ionized. Here, ignition is required for generating the initial plasma.

In DC bipolar discharge, the plasma ignition conditions, in principle, follow Paschen's law. This law is a law that generally holds true regarding the relation of the firing potential relative to the product (pd product) of the interelectrode distance and the ambient pressure, and the firing potential; that is, the minimum discharge voltage, indicates a minimum value at a certain pd product value, and generally tends to drastically increase when the pd product value becomes any lower; that is, the firing becomes difficult. Thus, according to this law, the initial ignition of plasma becomes more difficult as the ambient pressure decreases when there is no change in the interelectrode distance, and this coincides with numerous empirical tendencies.

Nevertheless, in recent years, from the perspective of improving the film quality by reducing the residual gas components in the film as much as possible, there are demands for reducing the gas to be introduced during the process as much as possible. Moreover, conditions related to the ignition process are becoming stricter due to various factors such as the voltage application time being shortened from the perspective of improving the production yield, and the number of re-ignition processes caused by ignition failure being strictly limited from the perspective of protecting the device. Under the foregoing circumstances, an ultrahigh purity target material entails a problem in that the ignition process tends to become unstable, and there is a dilemma of using a low purity product to increase the ignition success rate, or using a high purity product to improve the quality.

Because the problem here is only in the ignition process as the first stage of the deposition process, the subsequent deposition process can be continued without any problem so as long as the plasma can be stably maintained, and it would be sufficient to realize a target comprising characteristics which only affect the ignition process, and do not contribute to the subsequent deposition process. It may be possible to realize this kind of target by controlling the shape or structural features of the target surface, Patent Document 1 to Patent Document 4 are known as patent documents which disclose sputtering targets having a unique shape.

Patent Document 1 discloses a technology of suppressing the impedance fluctuation of a cathode circuit by forming an annular groove in the form of a V-shape, circular arc or square shape on a part of the target surface and thereby increasing the surface area of the target. Moreover, Patent Document 2 discloses a technology of attempting to expand the effective erosion area in a target by forming a groove for magnetic flux leakage near the magnetic flux concentrated region of a magnetic target for use in magnetron sputtering, and causing the plasma to also work around the groove.

Patent Document 3 discloses a technology of attempting to improve the deposition rate by causing ions to enter the target surface obliquely and suppress the reattachment of particles on the sputter surface as a result of forming a plurality of inclined planes having a height of 1 to 10 mm on the target surface. Patent Document 4 discloses a technology of causing foreign matter, which tends to accumulate at a portion with low plasma density, to be attached in a concave part so to prevent such foreign matter from protruding from the surface, and additionally preventing the generation of an abnormal discharge between the target and a shield by forming such concave part on the outer periphery of the target surface where the plasma density is low. Patent Document 1 to Patent Document 4 described above all intentionally change the shape of a part of the outer peripheral surface configuring the sputtering target, but have no intention of resolving the problem related to the stability of the initial ignition of plasma, and do not even suggest the consequent effects that are yielded as a result of resolving the foregoing problem. Thus, Patent Document 1 to Patent Document 4 are not considering the shape or structure of their targets from the foregoing perspective.

Patent Document 5 discloses a technology of forming a distributed structure of an imprint (convexoconcave shape) by pressing a tool having a protrusion against the lateral face of a target, wherewith such structure is able to prevent the fall or separation of attachments. In Patent Document 5, the purpose of deforming the target surface by pressing a tool against the target surface is not for stabilizing the initial ignition of plasm but for preventing the fall or separation of attachments. Needless to say, specific pressing conditions, structure and target properties suitable for stabilizing the initial ignition of plasma are not disclosed in Patent Document 5.

CITATION LIST

Patent Documents

[Patent Document 1] WO 2006/054409 A
[Patent Document 2] JP 2003-226965 A
[Patent Document 3] JP 2003-027225 A
[Patent Document 4] JP 2004-084007 A
[Patent Document 5] JP 2004-511656 A

SUMMARY

The present invention was devised in view of the foregoing circumstances, and an object of this invention is to provide a sputtering target which is free from any retry (reignition) or device stoppage due to an ignition failure upon the initial plasma ignition (ignition) during sputtering and which is capable of starting sputtering stably. In particular, an object of this invention is to provide a sputtering target which is capable of starting sputtering stably even under circumstances that are disadvantageous to ignition such as the use of a high purity material or reduction of introduced gas.

Based on the foregoing discovery, the present invention provides the following technology.

1) A sputtering target comprising a flat part and a tapered part on a sputter surface, wherein at least a surface portion of the tapered part includes a crystal distortion having an average KAM value of 0.5° or more.

2) The sputtering target according to 1) above, wherein a region of the tapered part including a crystal distortion having an average KAM value of 0.5° or more reaches a region which is 0.4 mm or more in depth from the surface.

3) The sputtering target according to 1) or 2) above, wherein a portion including a crystal distortion having an average KAM value of 0.5° or more is only the tapered part.

4) The sputtering target according to any one of 1) to 3) above, wherein a shape of a portion of the tapered part including a crystal distortion is a knurled shape having a maximum depth of 500 µm, a width of 1 mm or less, and a pitch of 2 mm or less.

5) The sputtering target according to any one of 1) to 4) above, wherein the sputtering target is formed from tantalum having a purity of 4N5 or higher.

The sputtering target of the present invention can lower the ignition failure rate of ignition (plasma ignition) even under conditions such as reduction of introduced gas and shortening of voltage application time, and start the sputter process stably. Because the downtime of the device can thereby be shortened, it is possible to contribute to the improvement in throughput and cost performance.

BRIEF DESCRIPTION OF DRAWINGS

FIG. 1 is a schematic plan view (top) and a schematic cross section (bottom) of the sputtering target of the present invention.

FIG. 2(a) is a tapered part KAM value measurement sample of the present invention, and FIG. 2(b) is a KAM mapping image of the sputtering target.

FIG. 3 shows an example of subjecting the KAM mapping image of the sputtering target of the present invention to separate evaluation for each visual field of observation in the depth direction.

FIG. 4(a) is an overall image of the sputtering target of Example 1 and FIG. 4(b) is an enlarged image of the tapered part.

DETAILED DESCRIPTION

The sputtering target of the present invention comprises a flat part and a tapered part on a sputter surface. The term "sputter surface" refers to the surface of the sputtering target that is exposed to plasma. Moreover, the term "tapered part" refers to a portion which was subject to chamfering relative to the lateral face of the target at the outer peripheral edge of the sputter surface of the sputtering target, and is a portion which substantially does not contribute, or which hardly contributes, to the deposition. Moreover, the term "flat part" refers to a portion of the sputter surface excluding the tapered part which substantially contributes to the deposition, and is the target surface to be sputtered which is orthogonal to the vertical line that connects the object, onto which a film is to be deposited via sputtering, and the target.

The sputtering target of the present invention is characterized in that crystal distortion processing is performed to the tapered part of the sputter surface described above. Here, as the crystal distortion, the KAM (Kernel Average Misorientation) value may be used as the index; the sputtering target of the present invention, the tapered part includes a crystal distortion having an average KAM value of 0.5° or more. This KAM value is obtained by analyzing the result of the Electron Back Scatter Diffraction (EBSD) measurement as described later in detail, and, in the present invention, the KAM value of the tapered part is evaluated from the EBSD measurement result of the cross section at a predetermined position of the tapered part. In the present invention, the evaluation of this KAM value is calculated as an average value for each region obtained by sequentially dividing, for each 200 µm in the depth direction, the KAM mapping image obtained from the EBSD measurement in units of a measurement range of a vertical length (depth direction) of 200 µm and a horizontal length (direction parallel to the surface) of 1200 µm, and, in the present invention, the expression "at least a surface portion of the tapered part includes a crystal distortion having an average KAM value of 0.5° or more" means that the average of the KAM values calculated from the measurement range of a vertical length of 200 µm and a horizontal length of 1200 µm, which is closest to the surface in the cross section at a predetermined position of the tapered part, is 0.5° or more.

Because this kind of portion having the crystal distortion of the tapered part facilitates the generation of an electron avalanche upon generating plasma, it can considerably contribute to the generation and stabilization of ignition. While this mechanism is not necessarily clear, it is considered as follows; the changes in the shape and energy level that occur upon applying crystal distortion cause the penetration depth to become shallow when the primary charged particles (Ar ions, electrons) enter the target, then the energy of the primary charged particles is propagated to the electrons near the target surface. This is considered to be one of the causes to improve the secondary electron emission probability. Moreover, as a result of introducing crystal distortion, the segregation of impurities and gas components will occur at the crystal grain boundary portion. The grain boundary portion with the segregated impurities and gas components becomes a portion where the secondary electron emission probability increases locally in comparison to the around structure, and it is also possible to say that the probability of a discharge occurring is improved as a result of the secondary electron emission from this portion being promoted.

The sputtering target of the present invention is now explained in further detail with reference to FIG. 1. The upper diagram of FIG. 1 shows the sputter surface of the sputtering target, and the lower diagram of FIG. 1 shows the cross section of the sputtering target. Note that FIG. 1 is merely one mode for facilitating the understanding of the present invention, and this invention is not limited to this mode. The present invention covers various modifications in addition to the modes explained below.

Crystal distortion is introduced at least to the tapered part on the side of the sputter surface of the target, and crystal distortion may also be formed across the flat part or the lateral face in addition to the tapered part. In cases where the target is disposed by facing the wafer, when introducing crystal distortion to the flat part as the plane that is parallel to the wafer surface, it is desirable to introduce the crystal distortion to the portion (low erosion region) which is hardly involved in the deposition. This is because, while the sputter rate of a substance differs depending on the crystal plane orientation, because a disturbance in the orientation of the crystal grains will occur at the portion where crystal distortion is introduced, the sputter rate will differ in comparison to the portion where crystal distortion is not introduced, and, if these two portions coexist at a portion that contributes to the deposition of the flat surface, it would have an adverse effect on the uniformity of the film thickness. Moreover, with a target that is made from a magnetic material, there are cases where the amount of flux leakage will change at the portion where crystal distortion is introduced, and the influence on the current-voltage change during deposition may increase. Because a region that is not eroded in any way is a portion where primary charged particles (Ar ions, electrons) that contribute to ignition do not enter the target, or a portion where the re-attachment amount of the film is considerable, even if crystal distortion is introduced into such a portion, the effect is considered to be extremely low.

It depends on the specification of the sputter device whether to introduce crystal distortion only to the tapered part, or across the tapered part and the flat part, or across the tapered part and the lateral face, or across all regions of the tapered part and the flat part and the lateral face. Thus, the introduction of the crystal distortion may be suitably selected according to such specification of the sputter device. In order to avoid the foregoing issues related to film thickness uniformity and leakage magnetic flux, it would be safe to introduce the crystal distortion only to the tapered part.

With the sputtering target of the present invention, when the KAM value is evaluated as the index of the crystal distortion, the average KAM value of at least the surface portion of the tapered part will be 0.5° or more, but when this is less than 0.5°, there will be no difference in the structure in comparison to conventional targets from the perspective of stabilization of the initial plasma ignition. The average KAM value of the surface of the tapered part is preferably 1.0° or more, and more preferably 1.5° or more. Moreover, in the evaluation of the KAM value in the present invention, the maximum value is set to 5° in order to improve the reliability of the measurement evaluation while preventing the KAM value from being evaluated excessively in comparison to the value reflecting the original crystalline orientation due to the existence of the crystal grain boundary. Thus, with the KAM value evaluation method of the present invention, an evaluation value of 5° or more cannot be obtained. When giving consideration to a range which more accurately reflects the crystal distortion, the upper limit of the KAM value which is desirable for yielding the effects of the present invention is 3°.

While the region which contributes to the discharge characteristics at the initial stage of starting sputtering is a region up to a range in which the depth from the target surface is roughly several μm, even with a tapered part with a low erosion rate, because the surface portion is sputtered and consumed pursuant to the use of the target, it is desirable to have a crystal distortion in which the average KAM value is 0.5° or more at least up to a depth of roughly 0.4 mm from the surface in order to sufficiently maintain the effect throughout the life of the target. If the depth of the portion having the crystal distortion is insufficient, the number of sites of grain boundaries, which may become the secondary electron emission source considered to contribute to the stabilization of the plasma ignition when the erosion advances, will become insufficient.

The crystal distortion to be introduced at least to the tapered part can be introduced based on an arbitrary means capable of applying distortion to the crystal structure; for instance, plastic deformation such as cold forging, rolling, or pressing (press), or, in certain cases, cutting based on predetermined conditions. Among the above, a knurling process based on pressing using a tool such as a pressing piece having knurled shape protrusions is favorable from the perspective that crystal distortion can be easily introduced without having to considerably change the target shape before or after the process, and that the amount of distortion to be introduced can be controlled with relative high precision.

When introducing crystal distortion to at least the tapered part based on the knurling process, the amount of distortion to be introduced can be controlled based on processing conditions such as the pressing force and angle of the pressing piece, and the number of times pressing is to be performed. The optimal processing conditions for achieving a crystal distortion of an average KAM value of 0.5° or more on the surface of the tapered part will differ depending on the target material and the tool material, and the knurled shape of the tool. Because the number of contact points per unit area will decrease when the pitch of knurling is increased, when the pressing force is the same, the amount of distortion that enters the target will increase as the pitch is larger. Moreover, when the pressing force is increased, because the pressure per unit area will increase when the pitch is the same, the amount of distortion that enters the target will increase as the pressing force is greater. Because the pressing force=pressing amount depends on the height of the apex of the piece, when the apex angle is 90°, this will become the maximum amount in which half the pitch is pressed. If the target material to be processed and the processing tool to be used are selected in light of the above and the relation between the pressing force and the amount of distortion to be introduced is experimentally obtained in advance regarding the selected target material and processing tool, it will be possible to smoothly perform processing for introducing distortion having an average KAM value of 0.5° or more to the surface of the tapered part.

As an example of the knurling process, considered may be a pressing process of using a pressing piece of a knurled shape having an apex angle of 30 to 120° and a pitch of 0.1 to 5 mm, and pressing such pressing piece against the tapered part of the target at a pressing force of 0.5 to 5 mm in terms of notch depth. Here, the pattern of the pressing piece is transferred at the depth according to the pressing force, and a pattern in which the apex of a quadrangular pyramid is flat is formed on the tapered part. While the process is normally performed at room temperature under conditions without any heating, because the essential objective of the process of the present invention is to control the amount of crystal distortion of the processed surface, the process may also be performed under conditions in which the target is heated in order to control the crystal distortion to be an optimal amount.

Moreover, the introduction of crystal distortion to the tapered part of the target may also be achieved by performing cutting work of an arbitrary shape under conditions capable of applying proper distortion to the tapered part. In the foregoing case, in order to intentionally introduce crystal distortion to the tapered part, in comparison to a case of performing simple cutting, it is necessary to take heed to set cutting conditions that are suitable for the cutting tool to intentionally apply crystal distortion to the tapered part. In the foregoing case also, if the target material to be processed and the processing tool to be used and the cutting shape are selected and the relation between the processing conditions thereof and the amount of distortion to be introduced is experimentally obtained in advance regarding the selected target material and processing tool and cutting shape, it will be possible to smoothly perform processing for introducing distortion having an average KAM value of 0.5° or more to the surface of the tapered part.

The technology of the present invention can be suitably applied to a tantalum target having a purity of 4N5 (99.995%) or higher for forming a barrier film of a copper wire. Note that, in the present invention, a purity of 4N5 (99.995%) means that, upon analyzing the Ta ingot via Glow Discharge Mass Spectrometry (GDMS), the total value of Na, Al, Si, K, Ti, Cr, Mn, Fe, Co, Ni, Cu, Zn, and Zr is less than 50 wtppm.

Note that, in the present invention, the KAM value that is used as the index of the crystal distortion amount is defined as the value obtained by calculating the average of misorientation regarding all pixels that are adjacent to predetermined analyzed pixels in an Inverse Pole Figure (IPF) image, which is a crystal orientation mapping for each of the crystal grains obtained from EBSD. In the present invention, in order to evaluate the crystal distortion amount of the tapered part of the target, as shown in FIG. 2(a), an observation sample 201 of the portion enclosed with a dotted line is cut from the tapered part, and EBSD measurement is performed to a region 202 from the tapered surface up to a predetermined depth of the portion indicated with oblique lines on the sample observation surface. Calculation is performed according to the foregoing definition from the IPF image of the overall observation region that was consequently obtained, and then converted into a space mapping image of the KAM value. When a crystal grain boundary portion is included in the extracted pixels upon calculating the KAM value, the KAM value calculated by using such pixels will become an excessively large value, and an evaluation value that is inappropriate as the KAM value, which should be a value that is calculated based on the misorientation of the crystal grains, will be calculated. Thus, in order to eliminate any calculation error caused by such crystal grain boundary, in the present invention, evaluation is performed by limiting the maximum value of the KAM value to 5° as described above.

FIG. 2(b) is an example of the KAM mapping image of the portion of FIG. 2(a). While a KAM mapping image is an image representing a local KAM value at predetermined locations based on differences in the tone (light and shade in the drawing), as evident from FIG. 2(b), the feature of the sputtering target of the present invention is that the KAM value is larger at the upper part of the diagram near the tapered surface of the tapered part; that is, the amount of crystal distortion introduced to the target structure is great, and the crystal distortion is relatively smaller at regions of a certain depth or more. As described above, with the sputtering target of the present invention, because the KAM value tends to gradually decrease from the tapered surface of the tapered part in the depth direction, the evaluation of the present invention is performed by setting an average KAM value evaluation region for each 200 µm in the depth direction from the surface as shown in FIG. 3 in order to properly evaluate the KAM value, which changes in the depth direction, in correspondence with the depth. Moreover, with an actual KAM mapping image, because it is not possible to avoid the influence of such as machining marks that are created during the preparation of the observation sample, the length of the direction that is perpendicular to the depth direction in the average KAM value evaluation region; that is, the length of the direction along the tapered surface, is set to 1200 µm, which is sufficiently longer than the depth direction, in order to reduce the foregoing influence as much as possible. A rectangular region of 200 µm in the depth direction and 1200 µm in the direction along the tapered surface set as described above is defined as the unit region for evaluating the average KAM value in the present invention.

Even if the same sample is used, the KAM value will vary depending on the setting of the size of unit pixels upon calculating the KAM value, but it is standard practice to perform KAM analysis upon setting pixels to be sufficiently small in comparison to the crystal grains in the SEM image observed in EBSD. Otherwise, it is not possible to accurately measure the KAM value as an amount based on the difference in the orientation of local crystal grains. Those skilled in the art who are familiar with rules such as standards required for evaluating the appropriate crystal grain size and so on can properly set the magnification of the visual field of observation and the like. It goes without saying that the analysis in the present invention is also performed upon making appropriate settings in light of the above.

In the present invention, the KAM value of the samples is evaluated upon specifically performing the following processes.

(Surface Treatment of Sample to be Used for Evaluating KAM Value)

Cut a sample with a cutter and adjust the sample to a size that is suitable for EBSD measurement Case resin for accurate surface retention and load adjustment (resin which dissolves in acetone, etc. is used)
Remove unevenness, scratches and work-affected layer of surface part via following mechanical polishing
  Rough grinding via surface shaping and facing (water resistant paper)
  Precision polishing 1 using buff (diamond particles of 9 μm, 3 μm, 1 μm)
  Precision polishing 2 using buff (colloidal silica of 0.1 μm, 0.05 μm)
Dissolve resin and extract sample
Perform surface treatment using a chemical etching solution (mixed solution of hydrofluoric acid, nitric add, and hydrochloric acid)
Perform ultrasonic cleaning using acetone or ethanol to wash abrasive powder, etc.

Moreover, in the present invention, the ignition stability during ignition was evaluated by performing an ignition test based on the following procedures and conditions.
(Ignition Test)
First step "gas stabilization" (5 sec)
  Introduce 5 sccm of Ar gas.
Second step "ignition" (1 sec (5 sec to ignition))
With 5 sccm of Ar gas still introduced, apply 1000 W with DC power supply.
(Degree of vacuum: 0.2 to 0.3 mTorr)
Third step "vacuum drawing" (10 sec)
Perform vacuum drawing in the chamber (Degree of vacuum: 1 to 3 μTorr).
The ignition test is performed with the foregoing three steps as one cycle. The success/failure of ignition is determined based on whether actual power is reached within 5 sec from the start of application in the "ignition" of the second step. If ignition does not succeed within 5 sec, the process returns to the start of the "ignition" of the second step, and the set power is applied once again. If ignition does not succeed even after repeating the application of the set power four times in the "ignition" of the second step, ignition is determined to be a failure, and the process is stopped.

EXAMPLES

The present invention is now explained based on the following Examples. Note that these Examples are merely an exemplification for facilitating the understanding of the present invention, and this invention is not limited by these Examples in any way. In other words, the present invention is limited only by the scope of its claims, and covers various modifications other than the ensuing Examples explained herein.

Comparative Example 1

Foremost, a conventional target as a Comparative Example was prepared according to the following procedures. A tantalum raw material having a purity of 99.995% or higher was subject to electron beam melting, and the resulting product was cast to obtain an ingot. Next, the obtained ingot was subject to cold clamp forging and subsequently cut to obtain a billet. The obtained billet was subject to cold multi-directional forging and thereafter subject to recrystallization annealing at 900 to 1000° C., and then once again subject to cold multi-directional forging and thereafter subject to recrystallization annealing at 900 to 1000° C. Next, the forged ingot was subject to cold rolling and thereafter subject to stress relief/recrystallization heat treatment at 900 to 1000° C., a tapered part was formed at the outer periphery of the sputter surface via lathing under the following conditions; namely, work rotation speed of 200 rev/min and notch depth of 0.2 mm/rev, and a tantalum sputtering target having a diameter of 444 mm and a sputter surface diameter of 406 mm was thereby obtained. With this target, the target material before the final machining is basically free from distortion due to the final stress relief/recrystallization heat treatment. Though slight distortion may become introduced to the tapered part due to the standard lathing of the tapered surface performed thereafter, otherwise, no crystal distortion has been intentionally introduced to either the sputter surface or the lateral face.

The crystal distortion of the tapered part cross section of this target was subject to KAM value analysis by using EBSD, in the same manner as Example 1 described later, upon setting the maximum KAM value to 5° in units of a vertical length of 200 μm and a horizontal length of 1200 μm. Consequently, even when evaluation regions up to 1 mm from the surface in the depth direction (5 unit regions from the surface in the depth direction) were extracted and evaluated, the crystal distortion was only 0.41° to 0.46° in terms of an average KAM value, and fell below 0.5° in all evaluation regions. Note that, as the samples to be subject to EBSD measurement for evaluating the KAM value, the samples for evaluating the KAM value were subject to a surface treatment process in the same manner as the Examples described later to obtain samples that are suitable for measurement focusing on the crystal distortion. Next, as a result of evaluating the ignition stability of this target based on the foregoing ignition test and examining the ignition failure rate, the ignition failure rate was 100%.

Example 1

In a tantalum sputtering target having a diameter of 444 mm and a sputter surface diameter of 406 mm which was prepared in the same manner as Comparative Example 1, crystal distortion was intentionally introduced to the tapered part of the sputtering target by performing a knurling process of pressing, at a pressing force of 1.0 mm, a pressing piece of a knurled shape having an apex angle of 90° and a pitch of 2 mm against the tapered part at the outer periphery of the sputter surface. A photograph of this target is shown in FIG. 4 (FIG. 4(a) is an overall view, and FIG. 4(b) is an enlarged view of the tapered part). A lattice shape was formed on the tapered part via the foregoing pressing process. Subsequently, samples for evaluating the KAM value were prepared from this tapered part for performing EBSD measurement. As the samples to be subject to EBSD measurement for evaluating the KAM value, the samples for evaluating the KAM value were subject to a surface treatment process, and, by properly performing surface mirror polishing+ chemical etching treatment, samples that are suitable for measurement focusing on the original crystal distortion were obtained.

The crystal distortion of the tapered part cross section of the thus obtained samples was subject to KAM value analysis by using EBSD upon setting the maximum KAM value to 5° in units of a vertical length of 200 μm and a horizontal length of 1200 μm. Consequently, the regions in which the average KAM value, which was set as the effective crystal distortion amount in the present invention, was 0.5° or more were the regions from the surface to a depth of 1.4 mm (7 unit regions from the surface in the depth direction), and the average KAM value in these regions was 0.5° to 2.9°. Note that the measurement evaluation of the KAM value was performed using the crystal orientation analyzer OIM 6.0-CCD/BS manufactured by TSL (the same was used in the foregoing Comparative Example and the subsequent Examples). Next, as a result of evaluating the ignition stability of this target via the foregoing ignition test and examining the ignition failure rate ((number of ignition failures/number of ignition attempts)×100), the ignition failure rate was 12%, and considerable improvement in the ignition properties was observed in comparison to the target (Comparative Example 1) that does not have any crystal distortion in the tapered part.

Example 2

In a tantalum sputtering target (purity of 4N5 or higher) having a diameter of 444 mm and a sputter surface diameter of 406 mm which was prepared in the same manner as Comparative Example 1, intentional crystal distortion was introduced to the tapered part of the sputtering target by performing a knurling process of pressing, at a pressing force of 0.5 mm, a pressing piece of a knurled shape having an apex angle of 90° and a pitch of 1 mm against the tapered part at the outer periphery of the sputter surface. A lattice shape was formed on the tapered part via the foregoing pressing process. The crystal distortion of this tapered part cross section was subject to KAM value analysis by using EBSD in the same manner as Example 1 upon setting the maximum KAM value to 5° in units of a vertical length of 200 μm and a horizontal length of 1200 μm. Consequently, the regions in which the average KAM value, which was set as the effective crystal distortion amount in the present invention, was 0.5° or more were the regions from the surface to a depth of 0.8 mm (4 unit regions from the surface in the depth direction), and the average KAM value in these regions was 0.5° to 2.2°. Next, this target was sputtered under the same conditions as Example 1 and, as a result of examining the ignition failure rate according the same evaluation method as Example 1, the ignition failure rate was 17%, and Example 2 also exhibited considerable improvement in the ignition properties.

Example 3

In a tantalum sputtering target (purity of 4N5 or higher) having a diameter of 444 mm and a sputter surface diameter of 406 mm which was prepared in the same manner as Comparative Example 1, a processed groove having a V-shaped cross section was formed in a concentric shape via lathing against the tapered part at the outer periphery of the sputter surface. Here, crystal distortion was intentionally introduced to the tapered part of the sputtering target by performing lathing under the following conditions; namely, a work rotation speed of 200 rev/min and a notch depth of 0.5 mm/rev in which the groove width is 2 mm, depth is 2 mm, and groove length is approximately 1294 mm as the outer periphery and approximately 1281 mm as the inner periphery. The crystal distortion of this tapered part cross section was subject to KAM value analysis by using EBSD in the same manner as Example 1 upon setting the maximum KAM value to 5° in units of a vertical length of 200 μm and a horizontal length of 1200 μm. Consequently, the regions in which the average KAM value, which was set as the effective crystal distortion amount in the present invention, was 0.5° or more were the regions from the surface to a depth of 0.4 mm (2 unit regions from the surface in the depth direction), and the average KAM value in these regions was 0.5° to 1.1°. Next, this target was sputtered under the same conditions as Example 1 and, as a result of examining the ignition failure rate according the same evaluation method as Example 1, the ignition failure rate was 43%.

The foregoing results are summarized in Table 1.

TABLE 1

| | Mode of introducing distortion in tapered part | Depth of introduced distortion (mm) | KAM crystal distortation (°) | Ignition failure rate (%) |
|---|---|---|---|---|
| Example 1 | Apex 90°-2 mm pitch knurling<br>1 mm pressing | 1.4 | 0.5-2.9 | 12 |
| Example 2 | Apex 90°-1 mm pitch knurling<br>0.5 mm pressing | 0.8 | 0.5-2.2 | 17 |
| Example 3 | Lathe of cross-sectional V-shaped circular groove having width of 2 mm and depth of 2 mm<br>Work rotation speed 200 rev/min, notch depth 0.5 mm/rev | 0.4 | 0.5-1.1 | 43 |
| Comparative Example 1 | (Only tapered part is subject to lathing)<br>(Work rotation speed 200 rev/min, notch depth 0.2 mm/rev) | — | 0.41-0.46<br>(region up to depth of 1 mm) | 100 |

INDUSTRIAL APPLICABILITY

The sputtering target of the present invention can lower the ignition failure rate of ignition (plasma ignition) even under conditions such as reduction of introduced gas and shortening of voltage application time, and start the sputter process stably. Because the downtime of the device can thereby be shortened, it is possible to contribute to the improvement in throughput and cost performance. The sputtering target of the present invention is effective for forming thin films of electronic devices.

REFERENCE SIGNS LIST 100 target body
101 sputter surface flat part
102 sputter surface tapered part
110 backing plate
210 target body
211 backing plate

The invention claimed is:
1. A sputtering target having a sputtering face to be exposed to plasma, the sputtering face comprising a flat part and a tapered part inclined from and adjacent to the flat part, wherein a portion of the sputtering face including at least the tapered part has a surface processed to give the surface an irregular feature comprising depressions, projections, or both, and a crystal distortion expressed as an average Kernel Average Misorientation (KAM) value of 0.5° or more, wherein the surface is an as knurled surface comprising an array of depressions having a maximum depth of 500 μm, a width of 1 mm or less, and a pitch of 2 mm or less, and wherein the crystal distortion of average KAM value of 0.5° or more extends from the surface of the portion and reaches a depth of 0.8 mm from the surface.

2. The sputtering target according to claim 1, wherein the portion of the sputtering face having the crystal distortion is located only within the tapered part.

3. The sputtering target according to claim 2, wherein the sputtering target comprises tantalum having a purity of 4N5 or higher.

4. The sputtering target according to claim 1, wherein the sputtering target comprises tantalum having a purity of 4N5 or higher.

5. The sputtering target according to claim 1, wherein the crystal distortion of average KAM value of 0.5° or more extends from the surface and reaches a depth of 1.4 mm from the surface.

6. The sputtering target according to claim 1, wherein the crystal distortion expressed as an average Kernel Average Misorientation (KAM) value is 0.5° or more and 3° or less.

* * * * *